(12) United States Patent
Hori et al.

(10) Patent No.: US 8,044,414 B2
(45) Date of Patent: Oct. 25, 2011

(54) SEMICONDUCTOR LAYERED STRUCTURE AND ITS METHOD OF FORMATION, AND LIGHT EMITTING DEVICE

(75) Inventors: Yuji Hori, Aichi (JP); Bruno Daudin, Tronche (FR); Edith Bellet-Amalric, Poisat (FR)

(73) Assignees: NGK Insulators, Ltd., Nagoya (JP); Commissariat a l'Energie Atomique, Paris (FR)

( * ) Notice: Subject to any disclaimer, the term of this patent is extended or adjusted under 35 U.S.C. 154(b) by 649 days.

(21) Appl. No.: 12/031,082

(22) Filed: Feb. 14, 2008

(65) Prior Publication Data

US 2008/0157102 A1 Jul. 3, 2008

Related U.S. Application Data

(63) Continuation of application No. PCT/JP2006/316280, filed on Aug. 14, 2006.

(30) Foreign Application Priority Data

Aug. 17, 2005 (EP) .................................. 05291738

(51) Int. Cl.
*H01L 33/00* (2010.01)
*H01L 21/20* (2010.01)

(52) U.S. Cl. .................... 257/88; 257/79; 257/E21.126; 257/E29.079; 257/E29.093; 257/E29.253; 257/E33.005; 257/E33.008; 438/483

(58) Field of Classification Search .................... 257/79, 257/99, E21.1, E21.108, E29.078, E29.093, 257/E29.253, E33.005, E33.008
See application file for complete search history.

(56) References Cited

U.S. PATENT DOCUMENTS

| 2001/0011731 | A1* | 8/2001 | Kim et al. ........................ 257/97 |
| 2002/0104998 | A1* | 8/2002 | Hori et al. ........................ 257/79 |
| 2002/0105004 | A1* | 8/2002 | Hori et al. ........................ 257/99 |
| 2003/0176003 | A1 | 9/2003 | Schaff et al. |
| 2004/0188691 | A1* | 9/2004 | Hori et al. ........................ 257/79 |
| 2006/0081860 | A1* | 4/2006 | Watanabe et al. ............... 257/97 |
| 2009/0206320 | A1* | 8/2009 | Chua et al. ....................... 257/13 |

FOREIGN PATENT DOCUMENTS

| EP | 1 211 736 A2 | 6/2002 |
| EP | 1 211 737 A2 | 6/2002 |
| JP | 10-079501 A1 | 3/1998 |
| JP | 2002-368267 A1 | 12/2002 |

(Continued)

OTHER PUBLICATIONS

Hori et al., "GaN Quantum Dots Doped With Tb", Applied Physics Letters 88, 053102 (2006).

(Continued)

*Primary Examiner* — Kenneth Parker
*Assistant Examiner* — David Spalla
(74) *Attorney, Agent, or Firm* — Burr & Brown

(57) ABSTRACT

In formation of a quantum dot structure in a light emitting layer, a matrix region (an n-type conductive layer and matrix layers) is formed on a growth underlying layer of AlN whose abundance ratio of Al is higher (or whose lattice constant is smaller) than that in the matrix region by an MBE technique, thereby to realize conditions where compression stress is caused in an in-plane direction perpendicular to the direction of growth of the matrix region, and then to form island crystals by self-organization in the presence of this compression stress. The compression stress inhibits an increase in lattice constant caused by the reduced abundance ratio of Al in the matrix region, i.e., to compensate for a difference in lattice constant between the island crystals and the matrix region. The compression stress functions to enlarge compositional limits for formation of the island crystals by self-organization to the Ga-rich side.

16 Claims, 4 Drawing Sheets

FOREIGN PATENT DOCUMENTS

| | | |
|---|---|---|
| JP | 2004-343074 A1 | 12/2004 |
| JP | 2005-294510 A1 | 10/2005 |
| JP | 2005-303333 A1 | 10/2005 |

OTHER PUBLICATIONS

Shen et al., "The Formation of GaN Dots on $Al_xGa_{1-x}N$ Surfaces Using Si in Gas-Source Molecular Beam Epitaxy", Applied Physics Letters 72, Jan. 19, 1998, pp. 344-346.

Nishi et al., "A Narrow Photoluminescence Linewidth of 21 meV at 1.35 μm From Strain-Reduced InAs Quantum Dots Covered by $In_{0.2}Ga_{0.8}As$ Grown on GaAs Substrates", Applied Physics Letters, vol. 74, No. 8, Feb. 22, 1999, pp. 1111-1113.

Kida et al., "Metalorganic Vapor Phase Epitaxy Growth and Study of Stress in AlGaN Using Epitaxial AlN as Underlying Layer", Jpn. J. Appl. Phys, vol. 42 (2003), pp. 572-574 (w/ Abstract).

\* cited by examiner

SEMICONDUCTOR LAYERED STRUCTURE AND ITS METHOD OF FORMATION, AND LIGHT EMITTING DEVICE

CROSS REFERENCE TO RELATED APPLICATIONS

This application is a continuation of International Application No. PCT/JP2006/316280, filed Aug. 14, 2006, and claims the benefit under 35 USC 119(a)-(d) of European Application No. 05291738.2, filed Aug. 17, 2005, the entireties of which are incorporated herein by reference.

FIELD OF THE INVENTION

The present invention relates to light emitting devices including group III nitrides and emitting light within a desired wavelength range, and especially having quantum dot structures in light emitting layers.

BACKGROUND OF THE INVENTION

Light emitting elements (light emitting devices) including group III nitrides and having quantum dot structures in light emitting layers are well known (see for example Japanese Patent Application Laid-open No. 2002-368267). Those devices achieve highly efficient emission by dispersing, in a matrix region, island crystals which are so minute as to cause quantum effects and which are doped with a predetermined rare-earth or transition-metal element, and then by using the resultant carrier confinement effect of quantum dots.

The formation of conventional quantum dot structures as disclosed in Japanese Patent Application Laid-Open No. 2002-368267 is done using so-called self-organizing techniques. Those are techniques for achieving quantum dot structures in epitaxial growth processes using well-known growth techniques such as MBE, by constituting the island crystals using a substance which has some difference in lattice constant from the one constituting the matrix region as well as by appropriately controlling the composition, the substrate temperature, the atmosphere, and the like. Those techniques allow easy formation of island crystals which act well as quantum dots, without requiring artificial and direct shape control such as micromachining.

It has been shown that no cracks are generated if a so-called AlN template substrate including an AlN film epitaxially formed on a predetermined single crystal base material is prepared and an AlGaN layer is epitaxially formed on the AlN template substrate by using a MOCVD technique to grow to a thickness of not less than 900 nm (see for example Y. Kida, T. Shibata, H. Miyake, and K. Hirayama "Metalorganic Vapor Phase Epitaxy Growth and Study of Stress in AlGaN Using Epitaxial AlN as Underlying Layer," Jpn. J. Appl. Phys. Vol. 42 (2003) pp. L572-L574). Such a thickness of 900 nm is a thickness much greater than a critical film thickness of tens of nanometers for crack generation which is theoretically expected.

SUMMARY OF THE INVENTION

In the formation of quantum dot structures by self-organization as disclosed in Japanese Patent Application Laid-open No. 2002-368267, substantially, the aforementioned difference in lattice constant is caused by a difference in composition between the constituents of the matrix region and the island crystals acting as quantum dots, both of which are composed of group III nitrides, and more specifically a difference in solid solubility of group III elements. This can be a limiting factor in the formation of current-injection type light emitting devices. For example in the case of forming a matrix region of $Al_xGa_{1-x}N$ and quantum dots of $In_yGa_{1-y}N$, quantum dot structures can easily be achieved because a difference in lattice constant increases with increasing value of x. Especially, the use of AlN is most desirable. However, on the other hand, conductivity decreases with increasing value of x, which makes device functions ineffective. That is, forming quantum dot structures by self-organization and having device conductivity are in the relation of trade-off with respect to changes in the composition of the matrix region.

The article by Y. Kida et al. shows that in-plane compression stress is present in the AlGaN layer when the AlGaN layer is formed on the AlN template substrate by using the MOCVD technique as mentioned above. However, such compression stress is decreased as the thickness of an $Al_{0.48}Ga_{0.52}N$ layer increases. It is hence difficult to form a matrix region thick enough to form quantum dot structures by using the MOCVD technique. The article by Y. Kida et al. also shows that cracks are generated in the AlGaN layer when GaN is used for an underlying layer.

The present invention has been made in view of the aforementioned problems and has an object to provide light emitting devices and their method of fabrication, which have quantum dot structures in light emitting layers and have reduced constraints on the composition of the matrix region.

A first aspect of the present invention is directed to a method of forming a semiconductor layer by epitaxial growth. The method includes the steps of: (a) forming an n-type conductive layer of a second group III nitride doped with a predetermined n-type dopant, on an underlying substrate which is obtained by forming an underlying layer of a first group III nitride on a predetermined base material, the first group III nitride being AlN; and (b) forming a functional layer with a quantum dot structure on the n-type conductive layer by repetition of the steps of: (b-1) forming a plurality of quantum dots of a third group III nitride by self-organization; and (b-2) forming a matrix layer of a fourth group III nitride. The step (a) and the step (b) are sequentially performed by MBE. The n-type conductive layer and the matrix layer form a matrix region. Each layer forming the matrix region is formed while maintaining compression stress in a direction generally perpendicular to a direction of deposition, the compression stress acting on an interface between the underlying layer and the matrix region. The step (b-1) is performed in the presence of the compression stress.

A second aspect of the present invention is directed to a method of forming a semiconductor layered structure by epitaxial growth. The method includes the steps of: (a) forming an n-type conductive layer of a second group III nitride doped with a predetermined n-type dopant, on an underlying substrate which is obtained by forming an underlying layer of a first group III nitride on a predetermined base material, the first group III nitride being AlN; and (b) forming a functional layer with a quantum dot structure on the n-type conductive layer by repetition of the steps of: (b-1) forming a plurality of quantum dots of a third group III nitride by self-organization; and (b-2) forming a matrix layer of a fourth group III nitride. The step (a) and the step (b) are sequentially performed by MBE. The n-type conductive layer and the matrix layer form a matrix region. Each layer forming the matrix region is formed so as to maintain alignment of the matrix region with the underlying layer and thereby to have a lattice constant which is smaller than an ideal lattice constant that a substance with the same composition has under non-stress conditions.

Preferably, the second group III nitride is $Al_xGa_{1-x}N$ ($0<x\leq 1$).

Preferably, an abundance ratio of Al in the fourth group III nitride is not more than that in the second group III nitride.

Preferably, the third group III nitride is GaN.

Preferably, in the step (b-1), the quantum dots are formed of the third group III nitride doped with a rare-earth or transition-metal element.

Preferably, the method further includes the steps of: (c) providing a first cladding layer in a lower end portion of the functional layer; and (d) providing a second cladding layer in an upper end portion of the functional layer. The step (a), the step (c), the step (b) and the step (d) are sequentially performed by MBE. The first and second cladding layers are formed of a group III nitride whose abundance ratio of Al being higher than that in the fourth group III nitride.

A third aspect of the present invention is directed to a semiconductor layered structure formed by epitaxial growth. The semiconductor layered structure includes a predetermined base material; an underlying layer formed of a first group III nitride on the base material, the first group III nitride being AlN; an n-type conductive layer formed of a second group III nitride doped with a predetermined n-type dopant, on the underlying layer; and a functional layer formed on the n-type conductive layer and having a quantum dot structure composed of repetition of unit layers, each of the unit layers being formed such that a plurality of quantum dots formed of a third group III nitride are buried in a matrix layer formed of a fourth group III nitride. The n-type conductive layer and the functional layer are sequentially formed by MBE. The n-type conductive layer and the matrix layer form a matrix region. Compression stress in a direction generally perpendicular to a direction of deposition remains in each layer forming the matrix region.

A fourth aspect of the present invention is directed to a semiconductor layered structure formed by epitaxial growth. The semiconductor layered structure includes a base material; an underlying layer formed of a first group III nitride on the base material, the first group III nitride being AlN; an n-type conductive layer formed of a second group III nitride doped with a predetermined n-type dopant, on the underlying layer; and a functional layer formed on the n-type conductive layer and having a quantum dot structure composed of repetition of unit layers, each of the unit layers being formed such that a plurality of quantum dots formed of a third group III nitride are buried in a matrix layer formed of a fourth group III nitride. The n-type conductive layer and the functional layer are sequentially formed by MBE. The n-type conductive layer and the matrix layer form a matrix region. The matrix region is formed in alignment with the underlying layer. Each layer forming the matrix region has a lattice constant which is smaller than an ideal lattice constant that a substance with the same composition has under non-stress conditions.

Preferably, the second group III nitride is $Al_xGa_{1-x}N$ ($0<x\leq 1$).

Preferably, an abundance ratio of Al in the fourth group III nitride is not more than that in the second group III nitride.

Preferably, the third group III nitride is GaN.

Preferably, the quantum dots are formed of the third group III nitride doped with a rare-earth or transition-metal element.

Preferably, the semiconductor layered structure further includes: a first cladding layer provided in a lower end portion of the functional layer; and a second cladding layer provided in an upper end portion of the functional layer. The n-type conductive layer, the first cladding layer, the functional layer and the second cladding layer are sequentially formed by MBE. The first and second cladding layers are formed of a group III nitride whose abundance ratio of Al being higher than that in the fourth group III nitride.

A fifth aspect of the present invention is directed to a light emitting device including a predetermined p-type conductive layer formed on the functional layer in the semiconductor layered structure obtained by the method according to the first or second aspect of the present invention, and additionally including a predetermined electrode formed on each of the n-type conductive layer and the p-type conductive layer.

Preferably, the p-type conductive layer includes a superlattice structure including layers of a fifth group III nitride and layers of a sixth group III nitride deposited together in an alternating pattern, each of the layers of the fifth and sixth group III nitrides being doped with a predetermined p-type dopant.

A sixth aspect of the present invention is directed to a light emitting device including a predetermined p-type conductive layer formed on the functional layer in the semiconductor layered structure according to the third or fourth aspect of the present invention, and additionally including a predetermined electrode formed on each of the n-type conductive layer and the p-type conductive layer.

Preferably, the p-type conductive layer includes a superlattice structure including layers of a fifth group III nitride and layers of a sixth group III nitride deposited together in an alternating pattern, each of the layers of the fifth and sixth group III nitrides being doped with a predetermined p-type dopant.

The quantum dot structure is formed, with the difference in lattice constant between the quantum dots and the matrix region compensated for by stress conditions maintained in the matrix region in order to maintain desirable conditions for quantum dot formation. It is, therefore, possible to provide a semiconductor layered structure with reduced constraints on the composition and to provide a light emitting device including such a semiconductor layered structure.

Stress conditions in the matrix region can effectively be achieved by forming the underlying layer of AlN whose lattice constant is relatively small as compared with other group III nitrides. This effectively compensates for a difference in lattice constant between the island crystals and the matrix region.

Stress conditions can be maintained with reliability.

A large band gap between the matrix region and the quantum dots allows effective carrier confinement in the quantum dots. This increases emission efficiency in the case of causing emission from the quantum dots by application of voltage using predetermined techniques.

The quantum dots can cause excitation emission from the rare-earth or transition-metal element by voltage application using predetermined techniques. Further, emission of a desired hue of light, e.g., white light, is possible by controlling the type and concentration of the doped rare-earth or transition-metal element, the number of deposited matrix layers, and the like.

DETAILED DESCRIPTION OF THE INVENTION

First Preferred Embodiment

Structure of Light Emitting Device

Figure 1:
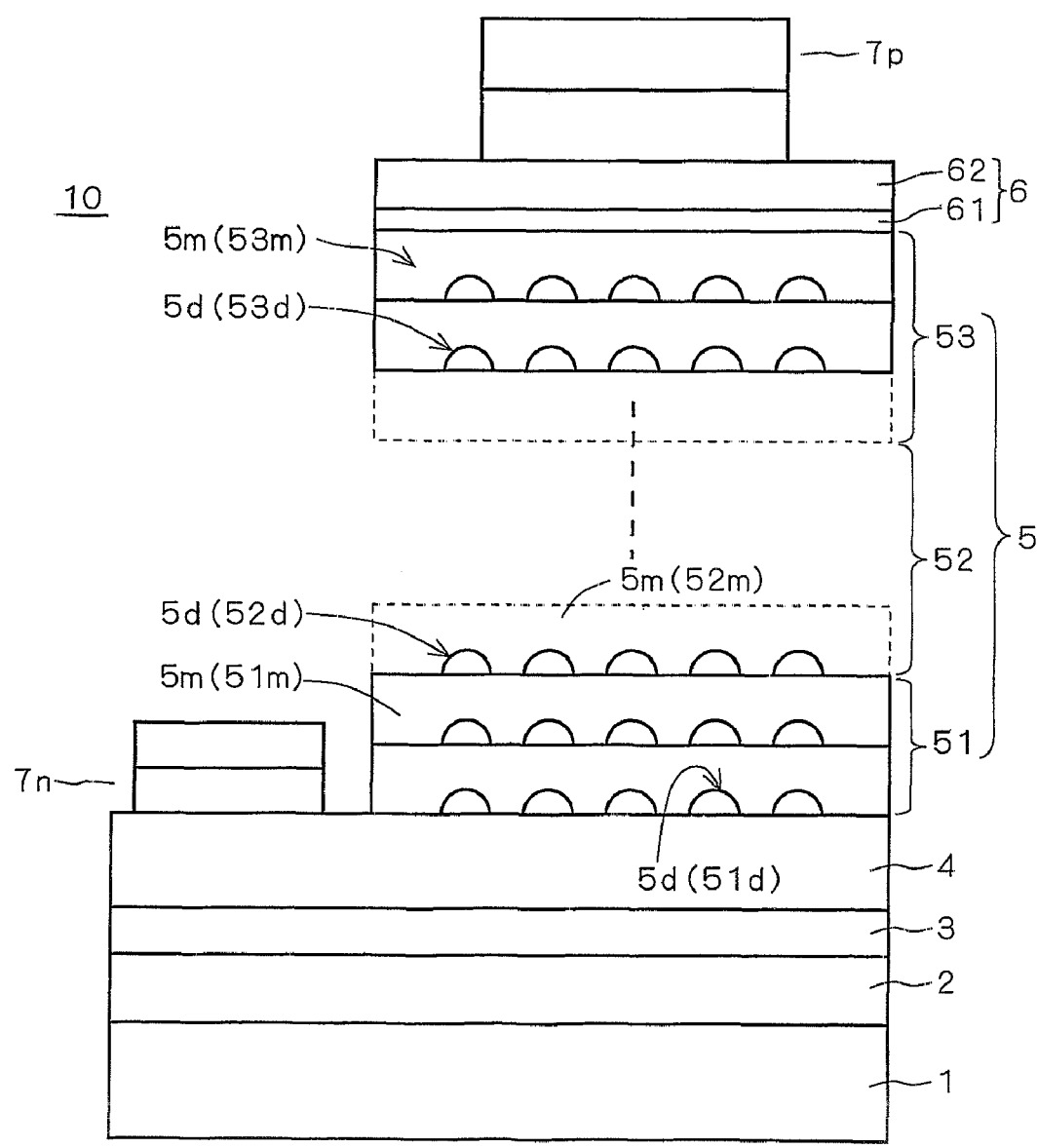
FIG. 1 is a schematic cross-sectional view showing the structure of the light emitting device 10 according to the first preferred embodiment of the present invention.

FIG. 1 is a schematic cross-sectional view showing the structure of a light emitting device 10 according to a first preferred embodiment of the present invention. The light emitting device 10 is a device with a (semiconductor) layered structure, in which a base material 1, an underlying layer 2, a buffer layer 3, an n-type conductive layer 4, a light emitting layer 5 with quantum dot structures including a number of island crystals 5d, and a p-type conductive layer 6, in this order, are deposited in layers. On the p-type conductive layer 6, a p-type electrode 7p of, for example, Au/Ni is formed. Part of the n-type conductive layer 4 is exposed, in which part an n-type electrode 7n of, for example, Al/Ti is formed. The light emitting device 10 is a device which causes emission from the light emitting layer 5 through energization caused by application of a predetermined value of voltage between the p-type electrode 7p and the n-type electrode 7n. For convenience of illustration, the ratio of thickness of the respective layers and the aspect ratios thereof in FIG. 1 do not reflect the actual scale.

The base material 1 can essentially be selected as appropriate according to the composition and structure of the underlying layer 2 to be formed thereon or according to techniques used for forming each layer including those formed further on the underlying layer 2. In this preferred embodiment, in order to form the underlying layer 2 of a group III nitride crystal whose major surface is a (0001) plane, it is preferable to use a (0001)-oriented SiC or a (11-20)- and (0001)-oriented sapphire, for example, for the base material 1. Or, the base material 1 may be selected as appropriate from any of the followings: various kinds of oxide materials such as ZnO, $LiAlO_2$, $LiGaO_2$, $MgAl_2O_4$, $(LaSr)(AlTa)O_3$, $NdGaO_3$, and MgO; various kinds of group IV single crystals such as Si and Ge; various kinds of group IV-IV compounds such as SiGe; various kinds of group III-V compounds such as GaAs, AlN, GaN, and AlGaN; and various kinds of boride single crystals such as $ZrB_2$. Although there is especially no material limitations, for convenience of handling, a material with a thickness of several hundreds μm to several millimeters is desirable for use as the base material 1.

The underlying layer 2 is formed on the base material 1. The underlying layer 2 is an epitaxial film which is formed of a group III nitride crystal including Al whose major surface is a (0001) plane, using well-known growth techniques such as MOCVD, MBE, HVPE (Hydride Vapor-Phase Epitaxy), and sputtering. The substrate temperature in the case of using the MOCVD technique is, for example, 1200° C. The MOCVD technique can be used in combination with other techniques such as PALE (Pulsed Atomic Layer Epitaxy) and plasma- or laser-assisted CVD. The MBE technique can also be employed in combination with similar techniques. The growth techniques such as MOCVD and MBE allow high-precision control of manufacturing conditions and thus are suitable for use in growing high-quality crystals. On the other hand, the HVPE technique allows the supply of a large amount of materials at a time and thus is suitable for use in growing thick films in a short time. It is also possible to combine those techniques for formation of the underlying layer 2.

Preferably, the underlying layer 2 should be formed of a group III nitride whose abundance ratio of Al to any other group III elements is higher than those in substances forming the n-type conductive layer 4 and the light emitting layer 5 which will be described later. More preferably, the underlying layer 2 should be formed of AlN. Further, the underlying layer 2 is formed to a thickness of approximately 1 to 2 μm.

In the case of forming the underlying layer 2 of AlN epitaxial film whose major surface is a (0001) plane, it is desirable, prior to the formation of the underlying layer 2, to form a surface nitride layer by nitriding of the surface of the base material 1. This reduces the dislocation density in the underlying layer 2 to $5 \times 10^{10}/cm^2$ or less, which is relatively low for the AlN epitaxial film. Nitriding is done by supplying, for example, $NH_3$ gas as well as a carrier gas to the surface of the base material 1. Thereby, a surface nitride layer containing nitrogen of approximately 7 at. % is formed at a depth of, for example, 1 nm in the base material 1.

The base material 1 and the underlying layer 2 formed thereon are sometimes treated integrally as a single substrate. In this case, this substrate is referred to as an "epitaxial substrate."

The buffer layer 3, the n-type conductive layer 4, the light emitting layer 5, and the p-type conductive layer 6, in this order, are sequentially formed by epitaxial growth on the underlying layer 2, using the MBE technique.

The buffer layer 3 is a layer which is formed by MBE and has approximately the same composition as the underlying layer 2. The buffer layer 3 is provided for the purpose of facilitating the formation of each layer to be described later. Substantially, the buffer layer 3 has the same function as the underlying layer 2. Thus, the buffer layer 3 is not an indispensable component of the light emitting device 10, and therefore, the n-type conductive layer 4 and the following respective layers may directly be formed on the underlying layer 2. Hereinafter, the underlying layer 2 and the buffer layer 3 will sometimes be referred to together as a growth underlying layer. This buffer layer 3 is formed to a thickness of approximately 50 nm. The growth temperature during formation of the buffer layer 3 is approximately 720° C., for example.

The n-type conductive layer 4 is a layer which is formed of a group III nitride having a composition of $Al_xGa_{1-x}N$ ($0 < x \leq 1$) and being doped with a predetermined n-type dopant. The n-type conductive layer 4 serves as a base layer during formation of the island crystals 5d. Here, the value of x is determined in consideration of the composition (abundance ratio of Al) of the growth underlying layer and the conductivity of the n-type conductive layer 4, based on the premise that the island crystals 5d are formed by self-organization, the details of which will be described later. For example, the group III nitride has a composition of $Al_{0.5}Ga_{0.5}N$.

The n-type conductive layer 4 is formed to a thickness of approximately several μm. The thickness of the n-type conductive layer 4 is determined based on its conductivity and whether the island crystals 5d are formed or not, which will also be described later. The growth temperature during formation of the n-type conductive layer 4 is approximately 700° C., for example.

One examples of the dopant is Si. Other possible examples are B and Ge. However, in the following description, in order to simplify the explanation, the application of a dopant to the n-type conductive layer 4 will not be referred to any further, unless needed.

During the formation of the n-type conductive layer 4 and other subsequent layers, indium (In) may be supplied in combination for serving as a surfactant on the crystal growth surface. In this case, indium (In) will contribute to an improvement in the crystal quality of each layer, but the surface temperature of the substrate will be set such that In will not be incorporated into each layer.

The light emitting layer 5 consists of three types of layers. One is a red-light emitting layer 51 emitting red (R) light; the second is a green-light emitting layer 52 emitting green (G) light; and the third is a blue-light emitting layer 53 emitting blue (B) light. The red-light emitting layer 51, the green-light emitting layer 52, and the blue-light emitting layer 53 each include a single or appropriate number of unit layers deposited one upon another, each unit layer being formed such that the island crystals 5d (51d, 52d, and 53d) are dispersed in a matrix layer 5m (51m, 52m, and 53m).

The island crystals 5d are formed of $Ga_yIn_{1-y}N$ (0<y≦1), preferably GaN, to such a minute size that quantum effects show up. The island crystals 5d are of approximately the same size and spaced at approximately equal intervals. That is, the light emitting layer 5 has quantum dot structures where the island crystals 5d serve as quantum dots.

The matrix layer 5m is a layer which is formed of a group III nitride having a composition of $Al_zGa_{1-z}N$ (0<z≦1) and being doped with the same n-type dopant as doped in the n-type conductive layer 4. The value of z is determined in consideration of the compositions (abundance ratios of Al) of the growth underlying layer and the n-type conductive layer 4, and the conductivity of the matrix layer 5m, based on the premise that the island crystals 5d are formed by self-organization, the details of which will be described later. Preferably, 0<z≦x. For example, the group III nitride has a composition of $Al_{0.5}Ga_{0.5}N$. In the following description, in order to simplify explanation, the application of a dopant to the matrix layer 5m will not be referred to any further, unless needed.

The island crystals 5d are doped with a rare-earth or transition-metal element which emits predetermined light upon excitation. The emission wavelength of each light emitting layer, i.e., the color of emission, is uniquely determined according to the type of the doped element. The island crystals 51d in the red-light emitting layer 51 are doped with an element, such as Eu, which emits red light upon excitation. The island crystals 52d in the green-light emitting layer 52 are doped with an element, such as Tb, which emits green light upon excitation. The island crystals 53d in the blue-light emitting layer 53 are doped with an element, such as Tm, which emits blue light upon excitation. FIG. 1 shows, by way of example, the case where the red-light emitting layer 51 includes two unit layers, the green-light emitting layer 52 includes more than two unit layers, and the blue-light emitting layer 53 includes three unit layers.

The formation of the unit layers is done by first forming the island crystals 5d on the n-type conductive layer 4 or a matrix layer 5m as a base layer by self-organization and then growing another matrix layer 5m to a thickness of approximately several to a dozen nm so as to bury the island crystals 5d therein. Each of the matrix layers 5m serves as a cap layer for the island crystals 5d as well as serving as a base layer in further forming the island crystals 5d. Requirements for forming the island crystals 5d by self-organization will be described later.

A region formed of the n-type conductive layer 4 and the matrix layers 5m will be referred to as a "matrix region (of the light emitting layer 5)." In the light emitting device 10, it can be said that almost horizontal planes on which the island crystals 5d are dispersed are spaced at predetermined intervals in the matrix region.

The p-type conductive layer 6 consists of a first layer 61 which is formed of a group III nitrides having a composition of $Al_xGa_{1-w}N$ (0≦w≦1) and being doped with a predetermined p-type dopant, and a second layer 62 which is formed of GaN doped with the same p-type dopant.

The group III nitride forming the first layer 61 is, for example, $Al_{0.07}Ga_{0.93}N$. The first layer 61 is formed to a thickness of approximately a dozen nm. One example of the dopant is Mg. Other possible examples are Zn and Be. The second layer 62 is formed to a thickness of approximately several hundreds nm. The growth temperature during formation of the p-type conductive layer 6 is approximately 700° C., for example.

In the light emitting device 10 with this configuration, a large band gap between a substance forming the matrix layers 5m and a substance forming the island crystals 5d allows effective carrier confinement in the island crystals 5d by application of voltage between the electrodes. This increases efficiency of excitation emission from dopants, thereby achieving the light emitting device 10 with improved emission properties.

Further, emission of a desired hue of light, e.g., white light, from the light emitting device 10 is possible by controlling the type and concentration of a rare-earth or transition-metal element to be doped in the island crystals 5d, the density of the island crystals 5d, the number of unit layers including the island crystals 5d, and the like.

Formation of Quantum Dot Structure by Self-Organization

Now, the formation of quantum dot structures by self-organization will be described, which is important for achieving the light emitting device 10 according to the first preferred embodiment of the present invention.

In the light emitting device 10 according to the first preferred embodiment of the present invention, the formation of quantum dot structures is achieved by establishing predetermined relationships in composition among the growth underlying layer (the underlying layer 2 by itself or including the buffer layer 3), the n-type conductive layer 4, the matrix layers 5m, and the island crystals 5d as well as by defining the thickness of each of the layers within a predetermined range, thereby to maintain the lattice constants of the respective layers, and hence stress acting on interfaces between the respective layers, in predetermined relation to each other.

More specifically, the n-type conductive layer 4 is epitaxially formed directly on the growth underlying layer and of $Al_xGa_{1-x}N$ whose abundance ratio of Al to any other group III elements is smaller than those in the group III nitrides forming the growth underlying layer. At this time, the n-type conductive layer 4 is formed in alignment with the growth underlying layer. Thus, the n-type conductive layer 4 grows under compression stress applied at the interface with the growth underlying layer in an in-plane direction perpendicular to the direction of epitaxial growth. This stress conditions will be relaxed with the growth of the n-type conductive layer 4 but will not completely be relaxed until the thickness of the n-type conductive layer 4 exceeds a predetermined value determined corresponding to the composition. That is, the n-type conductive layer 4 grows while somewhat maintaining the aforementioned alignment at the interface. For example, in the case of using $Al_{0.5}Ga_{0.5}N$, sufficient stress will remain even with the thickness of 1 μM. Accordingly, stress remains in the vicinity of the uppermost surface portion of the n-type conductive layer 4, which conditions achieve a smaller a-axis length than non-stress conditions.

For example, in the case of forming the growth underlying layer of AlN and the n-type conductive layer 4 of $Al_{0.5}Ga_{0.5}N$, lattice relaxation $\Delta a/a0$ (where a0 is the a-axis length at the start of growth; and $\Delta a$ is the total increment of the a-axis length from a0) during formation of the n-type conductive layer 4 is approximately 0.3%, which is determined by real-time observation of changes in lattice constant (a-axis length) in the in-plane direction, using RHEED (Reflection High Energy Electron Diffraction). This value is considerably smaller than the value, 1.2%, which is assumed from the a-axis length of $Al_{0.5}Ga_{0.5}N$ obtained under non-stress conditions (e.g., in a bulk state) where stress is completely relaxed away.

Figure 2:
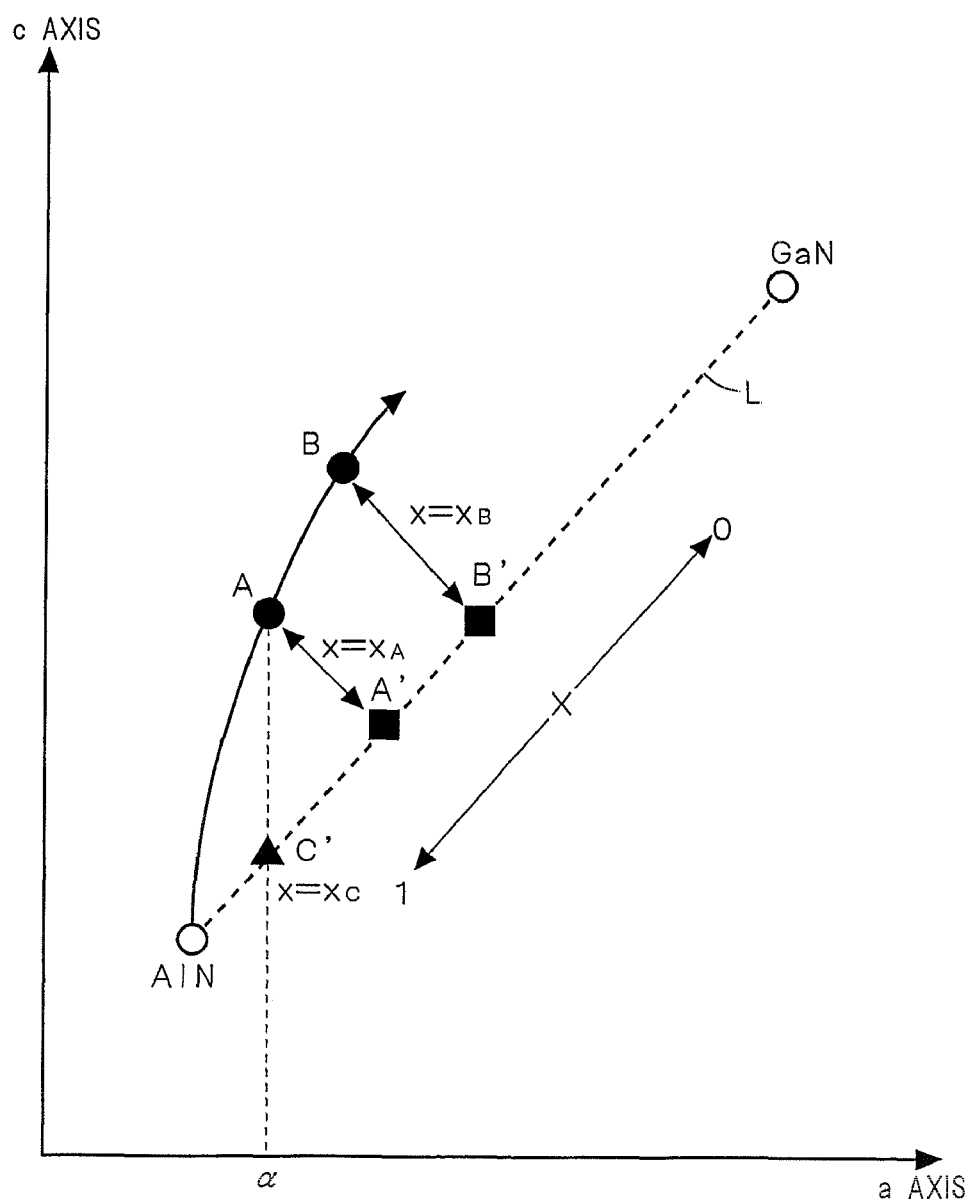
FIG. 2 is a schematic view showing the relationship between the lattice constant of $Al_xGa_{1-x}N$ forming the n-type conductive layer 4, and the value of x.

For explanation of this conditions, FIG. 2 schematically shows the relationship between the lattice constant (a and c axes) of $Al_xGa_{1-x}N$ forming the n-type conductive layer 4, and the value of x.

In FIG. 2, the points A and B indicated by closed circles both represent the lattice constants of $Al_xGa_{1-x}N$ forming the n-type conductive layer 4 according to the first preferred embodiment of the present invention. The point A represents the case where $x=x_A$, and the point B represents the case where $x=x_B$. On the other hand, the broken line L connecting the points representing the lattice constants of AlN and GaN, both indicated by white circles, shows the relationship between the lattice constant of $Al_xGa_{1-x}N$ and the value of x under non-stress conditions. The points A' and B' on this broken line L represent the lattice constants of substances with the same composition as those indicated by the points A and B, respectively, which are obtained under non-stress conditions (which lattice constants will be hereinafter referred to as ideal lattice constants).

As above described, the first preferred embodiment of the present invention achieves conditions where stress remains in the n-type conductive layer 4. Correspondingly, the lattice constants of the n-type conductive layer 4, as indicated by the points A and B in FIG. 2, are the values that are shifted in a direction of increasing the axis ratio of c/a from the points A' and B' which represent the ideal lattice constants. At this time, for example if a is the a-axis length at the point A (in the case where $x=x_A$), a composition which takes the same value of a as the a-axis length under non-stress conditions is the composition represented by the point C on the broken line L. If the point C represents the case where $x=x_C$, the inequality, $x_A<x_C$, holds true. That is, in the n-type conductive layer 4 according to the first preferred embodiment of the present invention, the same lattice constant as a certain ideal lattice constant obtained under non-stress conditions can be achieved with a Ga-rich composition with a smaller value of x than obtained under the non-stress conditions.

Figure 3:
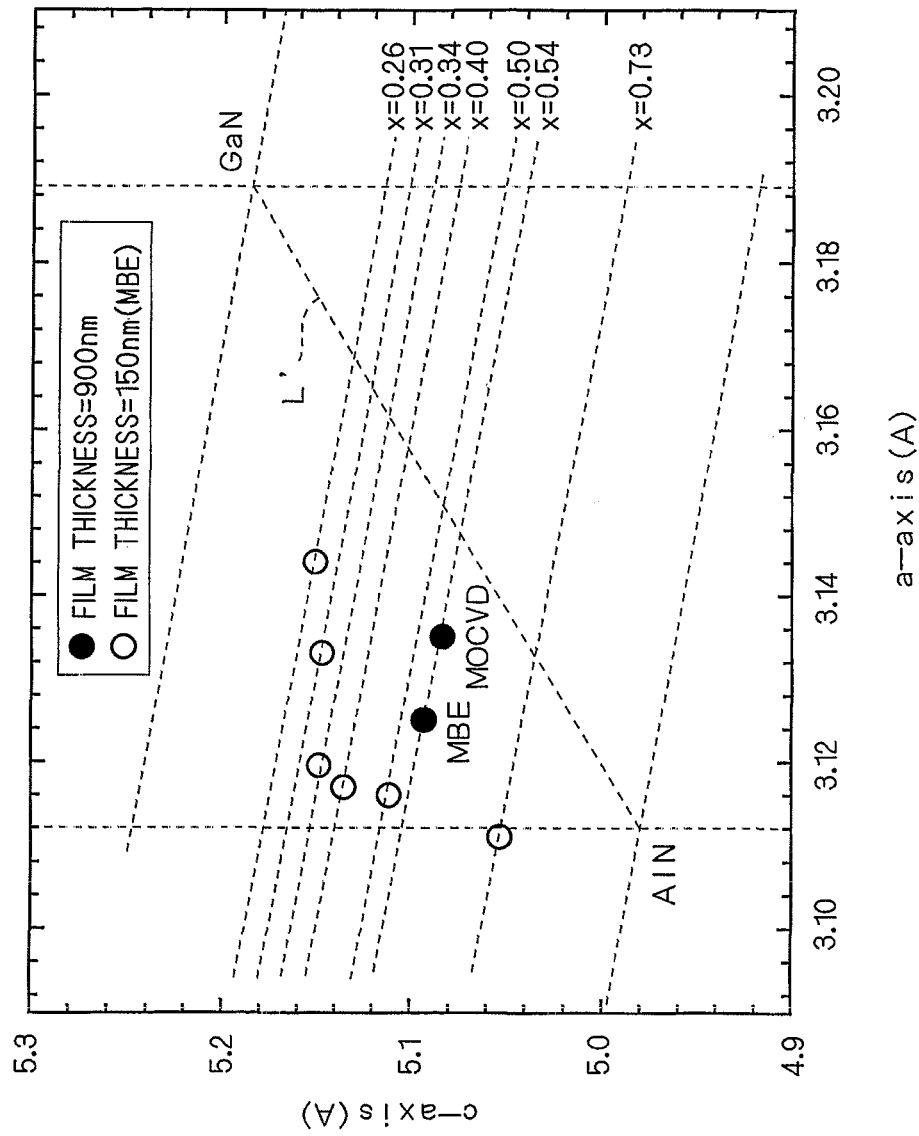
FIG. 3 is a view showing measurement results about the relationship between the lattice constant of $Al_xGa_{1-x}N$ forming the n-type conductive layer 4, and the value of x.

FIG. 3 shows the relationship between the values of the lattice constant (a and c axes) of $Al_xGa_{1-x}N$ and the value of x when $Al_xGa_{1-x}N$ layers having various compositions (or having different values of x) are produced on the growth underlying layer. Like the broken line L of FIG. 2, the broken line L' of FIG. 3 shows the relationship between the lattice constant of $Al_xGa_{1-x}N$ and the value of x under non-stress conditions. White circles indicate results obtained when the $Al_xGa_{1-x}N$ layers are formed to have a thickness of 150 nm. The closed circle labeled "MBE" indicates a result obtained when an $Al_{0.54}Ga_{0.46}N$ layer having a thickness of 900 nm is formed by MBE. The closed circle labeled "MOCVD" indicates a result obtained when an $Al_{0.54}Ga_{0.46}N$ layer having a thickness of 900 nm is formed by MOCVD.

The comparison between the closed circles in FIG. 3 shows that the use of the MBE technique as in the first preferred embodiment achieves greater compression stress acting than the use of the MOCVD technique. The present inventors have confirmed that, when the MBE technique is used, such compression stress is sufficiently maintained even if an $Al_xGa_{1-x}N$ layer having a thickness exceeding 1 μM is formed.

From the results of the white circles, it can be found that the compression stress acts within wide compositional limits ranging from an Al-rich composition to at least x=0.26. This indicates that the same lattice constant as the certain ideal lattice constant obtained under non-stress conditions can be achieved by the group III nitride of a Ga-rich composition with a smaller value of x than obtained under the non-stress conditions.

Then, using the n-type conductive layer 4 under such stress conditions as a base layer, the island crystals 5d of $Ga_yIn_{1-y}N$ are formed by self-organization. For the island crystals 5d, it is preferable to use $Ga_yIn_{1-y}N$ which has a sufficient difference in lattice constant from the n-type conductive layer 4 under the aforementioned stress conditions because of an increased interfacial energy between the n-type conductive layer 4 and the island crystals 5d. For example in the case of forming the n-type conductive layer 4 of $Al_{0.33}Ga_{0.67}N$, the island crystals 5d can be formed of GaN. Or, a more In-rich composition may be used.

After the formation of the island crystals 5d, a matrix layer 5m is formed of $Al_zGa_{1-z}N$ to form a single unit layer, and thereafter, the formation of a unit layer using a matrix layer 5m as a base layer is repeated to form the light emitting layer 5. Since the thickness of each unit layer, i.e., the thickness of one matrix layer 5m is, at most, a dozen nm, it is possible to realize conditions where, even though a number of unit layers are deposited in layers, stress existing in the uppermost surface portion of the n-type conductive layer 4 will be maintained until the uppermost one of the deposited layers, i.e., the aforementioned alignment will be maintained. Especially, defining the value of z within the range of $0<z\leqq x$ allows good stress relaxation (i.e., prevents cracks). If $0<z<x$, the n-type conductive layer 4 serves also as a barrier layer.

In summary, according to the first preferred embodiment of the present invention, in the formation of quantum dot structures in the light emitting layer 5, the matrix region (the n-type conductive layer 4 and the matrix layers 5m) is formed on the growth underlying layer whose abundance ratio of Al is higher (or whose lattice constant is smaller) than that in the matrix region, thereby to realize conditions where compression stress is caused in the in-plane direction perpendicular to the direction of growth of the matrix region, and then to form the island crystals 5d by self-organization in the presence of this compression stress. The compression stress functions to inhibit an increase in lattice constant caused by the reduced abundance ratio of Al in the matrix region. In other words, the compression stress functions to compensate for a difference in lattice constant between the island crystals and the matrix region, in order to maintain desirable conditions for quantum dot formation. As a result, it can be said that the compression stress functions to enlarge compositional limits for the formation of island crystals by self-organization to the Ga-rich side. This means that realizing such stress conditions eliminates compositional constraints on the formation of island crystals.

The use of the technique of forming the quantum dot structures according to the first preferred embodiment as described above appropriately provides the current-injection type light emitting device in which the light emitting layer includes the quantum dot structures having the island crystals of GaN.

Second Preferred Embodiment

Figure 4:
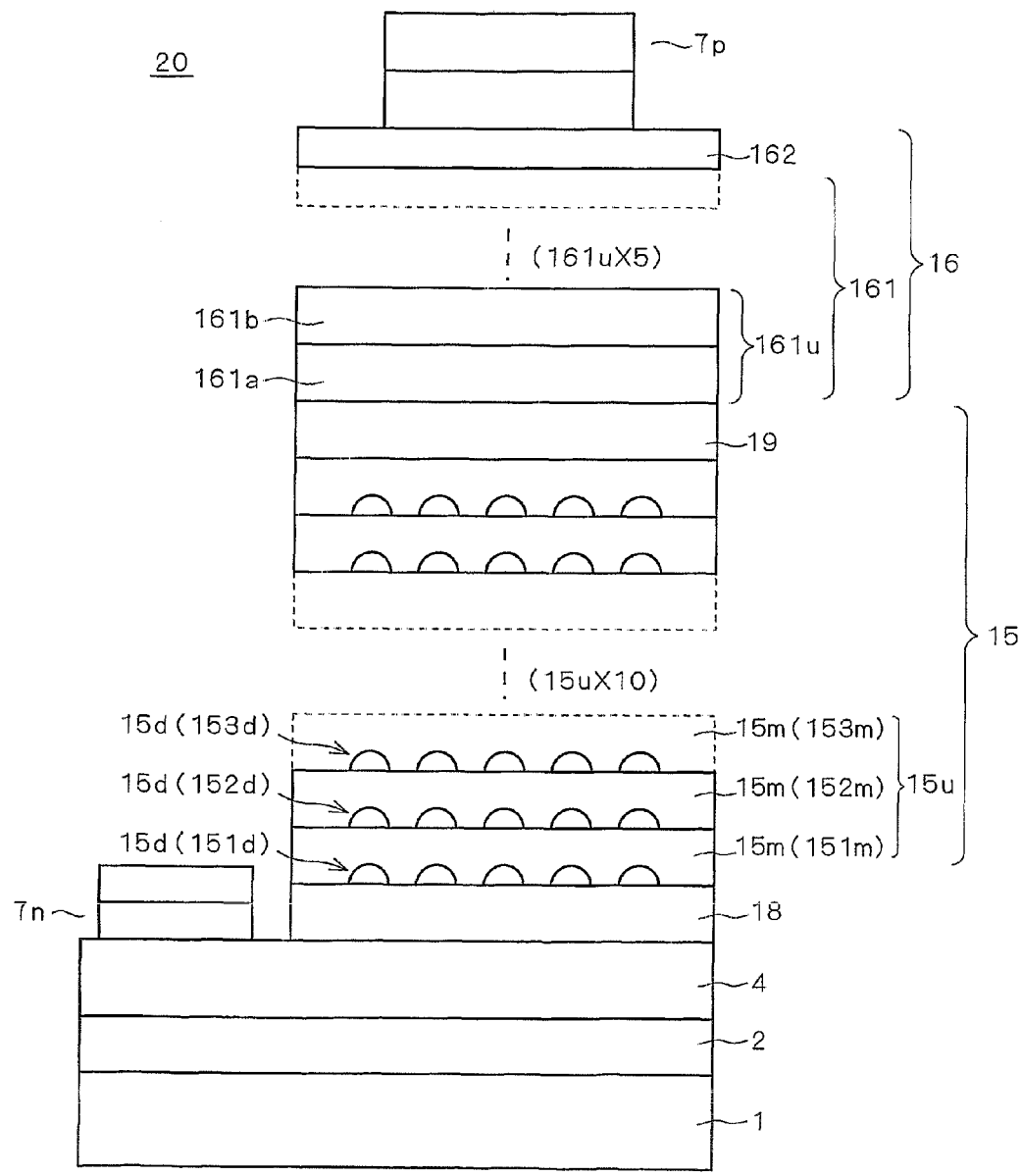
FIG. 4 is a schematic cross-sectional view showing the structure of the light emitting device 20 according to the second preferred embodiment of the present invention.

FIG. 4 is a schematic cross-sectional view showing the structure of a light emitting device 20 according to a second preferred embodiment of the present invention. Components of the light emitting device 20 according to the second preferred embodiment similar in function and effect to those of the light emitting device 10 according to the first preferred embodiment are designated by identical reference numerals and characters and will not be described. The light emitting device 20 is a device with a (semiconductor) layered structure, in which the base material 1, the underlying layer 2, the n-type conductive layer 4, a first cladding layer 18, a light emitting layer 15 with quantum dot structures including a multiplicity of island crystals 15d, a second cladding layer 19, and a p-type conductive layer 16, in this order, are deposited in layers. The n-type conductive layer 4, the first cladding layer 18, the light emitting layer 15 with the quantum dot structures including the multiplicity of island crystals 15d, the second cladding layer 19, and the p-type conductive layer 16, in this order, are sequentially formed by epitaxial growth on the underlying layer 2, using the MBE technique. On the p-type conductive layer 16, the p-type electrode 7p of, for example, Au/Ni is formed. Part of the n-type conductive layer 4 is exposed, in which part the n-type electrode 7n of, for example, Al/Ti is formed.

The light emitting device 20 is a device which causes emission from the light emitting layer 15 through energization caused by application of a predetermined value of voltage between the p-type electrode 7p and the n-type electrode 7n. For convenience of illustration, the ratio of thickness of the respective layers and the aspect ratios thereof in FIG. 4 do not reflect the actual scale.

The light emitting layer 15 of the light emitting device 20 according to the second preferred embodiment is similar in having a matrix structure to the light emitting layer 5 of the light emitting device 10 according to the first preferred embodiment. Unlike the light emitting layer 5, the light emitting layer 15 is formed by depositing an appropriate number of unit layer groups 15u one upon another, each of the unit layer groups 15u being composed of a unit layer in which island crystals 15d (151d) emitting red light are contained in a matrix layer 15m (151m), a unit layer in which island crystals 15d (152d) emitting green light are contained in a matrix layer 15m (152m), and a unit layer in which island crystals 15d (153d) emitting blue light are contained in a matrix layer 15m (153m). In FIG. 4, the ten unit layer groups 15u are shown as deposited one upon another.

In such a case, the island crystals 15d are formed by self-organization. Specifically, the matrix region is formed on the underlying layer 2 whose abundance ratio of Al is higher (or whose lattice constant is smaller) than that in the matrix region, thereby to realize conditions where compression stress is caused in the in-plane direction perpendicular to the direction of growth of the matrix region, and then to form the island crystals 15d in the presence of this compression stress. This compression stress results from the formation of the n-type conductive layer 4 in alignment with the underlying layer 2, as in the first preferred embodiment.

For the purpose of increasing light emitting efficiency in the light emitting device 20 according to the second preferred embodiment, the light emitting layer 15 is formed so as to be sandwiched between the first cladding layer 18 and the second cladding layer 19. Thus, the light emitting layer 15 is not directly formed on the n-type conductive layer 4 but is formed on the first cladding layer 18 provided on the n-type conductive layer 4. However, because the first cladding layer 18 is formed to have a thickness of, at most, about tens of nanometers, for example a thickness of about 20 nm, the aforementioned stress conditions are also maintained at the surface of the first cladding layer 18. Therefore, during the formation of the light emitting device 20 according to the second preferred embodiment, the island crystals 151d are formed in a bottommost portion of the light emitting layer 15 by using the cladding layer as a base layer.

The island crystals 15d and the matrix layers 15m may be formed of a group III nitride of the same composition as that in the light emitting device 10 of the first preferred embodiment. The island crystals 15d and the matrix layers 15m may be formed under the conditions similar to those of the island crystals 5d and the matrix layers 5m of the light emitting device 10 so as to be of similar size. Elements used as dopants for the island crystals 15d responsible for emitting light of the respective colors may be similar to those in the first preferred embodiment. Preferably, the first cladding layer 18 and the second cladding layer 19 are formed of a group III nitride which is more Al-rich than the matrix layers 15m.

As a preferable example, the island crystals 15d are formed of GaN, the matrix layers 15m are formed of $Al_{0.6}Ga_{0.4}N$, and the first cladding layer 18 and the second cladding layer 19 are formed of $Al_{0.7}Ga_{0.3}N$. In this case, lattice relaxation $\Delta a/a0$ during formation of the first cladding layer 18 is not greater than 0.05%.

The p-type conductive layer 16 includes a first layer 161 having a superlattice structure, and a second layer 162 formed of GaN. Specifically, the first layer 161 is formed by depositing an appropriate number of unit layers 161u one upon another, each of the unit layers 161u being composed of a lower layer 161a having a thickness of, at most, approximately tens of nanometers and formed of a group III nitride having a composition of $Al_{1-t}Ga_tN$ ($0 \leq t \leq 1$), and an upper layer 161b formed of GaN. Preferably, the second layer 162 has a thickness of approximately tens of to hundreds of nanometers. The first layer 161 and the second layer 162 are doped with a p-type dopant similar to that for the p-type conductive layer 6 of the light emitting device 10 of the first preferred embodiment. In FIG. 4, the five unit layers 161u are shown as deposited one upon another. As a preferable example, each of the lower and upper layers 161a and 161b of the first layer 161 is formed to have a thickness of 10 nm, and the second layer 162 is formed to have a thickness of 100 nm. In the light emitting device 10 according to the first preferred embodiment, the p-type conductive layer 16 having such a structure may be formed in place of the p-type conductive layer 6.

In the formation of quantum dot structures in the light emitting layer 15 of the light emitting device 20 according to the second preferred embodiment, as described hereinabove, the matrix region is formed on the growth underlying layer whose abundance ratio of Al is higher (or whose lattice constant is smaller) than that in the matrix region, thereby to realize conditions where compression stress is caused in the in-plane direction perpendicular to the direction of growth of the matrix region, and then to form the island crystals 15d by self-organization in the presence of this compression stress.

EXAMPLES

Example 1

As the base material 1, a 2-inch-diameter c-plane sapphire substrate with a thickness of 500 μm, which has been pretreated with $H_2SO_4+H_2O_2$, is prepared and placed in a MOCVD system. The MOCVD system is provided with supplies of gases such as $H_2$, $N_2$, TMA, TMI, TMG, $CP_2Mg$, $NH_3$, and $SiH_4$. $H_2$ is supplied at a flow rate of 10 m/sec to increase the temperature of the sapphire substrate to 1200° C. Then, $NH_3$ is supplied together with an $H_2$ carrier gas for five minutes to cause nitriding of the major surface of the sapphire substrate. When measured by X-ray photoelectron spectroscopy (XPS), the nitrogen content at a depth of 1 nm under the major surface is 7 at. %.

Then, TMA and $NH_3$ are supplied at a mean flow rate of 10 m/sec to epitaxially form an AlN layer as the underlying layer 2 to a thickness of 1 μm, thereby to obtain an epitaxial substrate. This epitaxial substrate is taken out from the MOCVD system and placed in an MBE system. In the MBE system, 7N Ga, 7N In, and 7N Al are provided as solid sources, and atomic nitrogen generated by a well-known high-frequency plasma system is provided as a nitrogen source. Also, solid sources of Si and Mg are provided as n- and p-type conductive dopants, respectively. Further, as dopants added to island crystals for causing emission, solid sources of Eu, Tb, and Tm are provided for use in red, green, and blue emissions, respectively.

In the MBE system, the epitaxial substrate is heated to 950° C. in a vacuum to clean up the surface of the substrate. Then, the growth temperature is set at 720° C., and Al and nitrogen are supplied to grow an AlN layer as the buffer layer 3 to a thickness of 50 nm.

The growth temperature is then reduced to 700° C., and Al, Ga, In, and Si, and atomic nitrogen are supplied to grow an n-$Al_{0.5}Ga_{0.5}N$ layer using Si as an n-type dopant to a thickness of 1 μm, as the n-type conductive layer 4. Here, In acts as a surfactant on the crystal growth surface, thereby improving crystal quality. However, In will not be incorporated into the n-$Al_{0.5}Ga_{0.5}N$ layer at this temperature of growth.

During the growth of the n-$Al_{0.5}Ga_{0.5}N$ layer, the lattice constant in the direction of the a-axis in the surface of that layer (in the plane) is observed real-time using RHEED. The result shows that lattice relaxation occurring is only approximately 0.3%, which is smaller than the value, 1.2%, that is assumed from the a-axis length of $Al_{0.5}Ga_{0.5}N$ under non-stress conditions.

Then, using Eu as a dopant, Ga and atomic nitrogen are supplied and dispersed on this n-$Al_{0.5}Ga_{0.5}N$ layer, whereby a number of island crystals 51d are formed with approximately the same size.

After the formation of the island crystals 51d, another n-$Al_{0.5}Ga_{0.5}N$ layer as the matrix layer 5m is formed on the surface to a thickness of approximately 10 nm. This again ensures surface flatness. Then, using Tb as a dopant, Ga and atomic nitrogen are supplied and dispersed to form a number of island crystals 52d of approximately the same size. Further, another n-$Al_{0.5}Ga_{0.5}N$ layer as the matrix layer 52m is formed on the surface to a thickness of approximately 10 nm. This again ensures surface flatness. Then, using Tm as a dopant, Ga and atomic nitrogen are supplied and dispersed to form a number of island crystals 53d of approximately the same size. Further, another n-$Al_{0.5}Ga_{0.5}N$ layer as the matrix layer 53m is formed thereon to a thickness of approximately 10 nm. This forms the light emitting layer 5 composed of red-, green-, and blue-light emitting layers each including a single unit layer.

After the formation of the light emitting layer 5, as the p-type conductive layer 6a, a p-$Al_{0.07}Ga_{0.93}N$ layer is formed to a thickness of 10 nm and a p-GaN layer is formed thereon to a thickness of 200 nm.

After the formation of the p-type conductive layer 6, part of the multilayered structure formed is etched until the n-$Al_{0.5}Ga_{0.5}$ layer is exposed. Then, the n-type electrode 7n is formed of Al/Ti on the exposed n-$Al_{0.5}Ga_{0.5}N$ layer. On the p-GaN layer, the p-type electrode 7p is formed of Au/Ni. Through the aforementioned processes, the light emitting device 10 is produced.

In the light emitting device 10 obtained in this way, a direct voltage of 5V is applied between the n-type electrode 7n and the p-type electrode 7p to flow a current of 25 mA. Then, high-intensity white emission is observed. That is, it has been shown that the light emitting device 10 according to the first preferred embodiment of the present invention can operate as a practical white light emitting source.

Example 2

An epitaxial substrate is prepared in accordance with a procedure similar to that in Example 1, and is placed in an MBE system similar to that in Example 1.

In the MBE system, the epitaxial substrate is heated to 950° C. in a vacuum to clean up the surface of the substrate. The temperature is then set at 700° C., and Al, Ga, Si, and atomic nitrogen are supplied to grow an n-$Al_{0.6}Ga_{0.4}N$ layer using Si as an n-type dopant to a thickness of 2 μm, as the n-type conductive layer 4.

Next, Al, Ga and atomic nitrogen are supplied onto the n-$Al_{0.6}Ga_{0.4}N$ layer to grow an $Al_{0.7}Ga_{0.3}N$ layer as the first cladding layer 18 to a thickness of 20 nm.

During the growth of the $Al_{0.7}Ga_{0.3}N$ layer, the lattice constant in the direction of the a-axis in the surface of that layer (in the plane) is observed real-time using RHEED. The result shows that lattice relaxation occurring is only not greater than 0.05%, which is smaller than the value, 0.22%, that is assumed from the a-axis length of $Al_{0.7}Ga_{0.3}N$ under non-stress conditions.

Then, using Eu as a dopant, Ga and atomic nitrogen are supplied and dispersed on this $Al_{0.7}Ga_{0.3}N$ layer, whereby a number of island crystals 151d are formed with approximately the same size.

After the formation of the island crystals 151d, an $Al_{0.6}Ga_{0.4}N$ layer as the matrix layer 151m is formed on the surface to a thickness of approximately 10 nm. This again ensures surface flatness. Then, using Tb as a dopant, Ga and atomic nitrogen are supplied and dispersed to form a number of island crystals 152d of approximately the same size. Further, another $Al_{0.6}Ga_{0.4}N$ layer as the matrix layer 152m is formed on the surface to a thickness of approximately 10 nm. This again ensures surface flatness. Then, using Tm as a dopant, Ga and atomic nitrogen are supplied and dispersed to form a number of island crystals 153d of approximately the same size. Further, another $Al_{0.6}Ga_{0.4}N$ layer as the matrix layer 153m is formed thereon to a thickness of approximately 10 nm. Thus, the formation of the unit layer group 15u composed of the three unit layers emitting red light, green light and blue light, respectively, is repeated ten times to form the light emitting layer 15.

After the formation of the light emitting layer 15, an $Al_{0.7}Ga_{0.3}N$ layer as the second cladding layer 19 is grown to a thickness of 20 nm.

After the formation of the second cladding layer 19, ten p-$Al_{0.5}Ga_{0.5}N$ layers as the lower layers 161a and ten p-GaN layers as the upper layers 161b are formed in an alternating pattern, each layer having a thickness of 10 nm, thereby to form the first layer 161 of the p-type conductive layer 16 having the superlattice structure.

Next, a p-GaN layer having a thickness of 100 nm is formed as the second layer 162 of the p-type conductive layer 16 on the first layer 161 having the superlattice structure. This provides the p-type conductive layer 16.

After the formation of the p-type conductive layer 16, part of the multilayered structure formed is etched until the n-$Al_{0.6}Ga_{0.4}N$ layer is exposed. Then, the n-type electrode 7n is formed of Al/Ti on the exposed n-$Al_{0.6}Ga_{0.4}N$ layer. On the p-GaN layer, the p-type electrode 7p is formed of Au/Ni. Through the aforementioned processes, the light emitting device 20 is produced.

In the light emitting device 20 obtained in this way, a direct voltage of 6V is applied between the n-type electrode 7n and the p-type electrode 7p to flow a current of 25 mA. Then, high-intensity white light emission is observed. That is, it has been shown that the light emitting device 20 according to the second preferred embodiment of the present invention can operate as a practical white light emitting source.

The invention claimed is:

1. A method of forming a semiconductor layered structure by epitaxial growth, comprising the steps of:
 (a) forming an n-type conductive layer of a second group III nitride doped with a predetermined n-type dopant, on an underlying substrate, said second group III nitride being $Al_xGa_{1-x}N$ ($0<x\leqq1$), which is obtained by forming an underlying layer of a first group III nitride on a predetermined base material, said first group III nitride being AlN; and
 (b) forming a functional layer with a quantum dot structure on said n-type conductive layer by repetition of the steps of:
 (b-1) forming a plurality of quantum dots of a third group III nitride, said third group III nitride being $Ga_yIn_{1-y}N$ ($0<y\leqq1$), by self-organization; and
 (b-2) forming a matrix layer of a fourth group III nitride, said fourth group III nitride being $Al_zGa_{1-z}N$ ($0<z\leqq1$),
 said step (a) and said step (b) being sequentially performed by MBE,
 said n-type conductive layer and said matrix layer forming a matrix region,
 each layer forming said matrix region being formed while maintaining compression stress in a direction generally perpendicular to a direction of deposition, said compression stress acting on an interface between said underlying layer and said matrix region,
 said step (b-1) being performed in the presence of said compression stress.

2. A method of forming a semiconductor layered structure by epitaxial growth, comprising the steps of:
 (a) forming an n-type conductive layer of a second group III nitride doped with a predetermined n-type dopant, on an underlying substrate, said second group III nitride being $Al_xGa_{1-x}N$ ($0<x\leqq1$), which is obtained by forming an underlying layer of a first group III nitride on a predetermined base material, said first group III nitride being AlN; and
 (b) forming a functional layer with a quantum dot structure on said n-type conductive layer by repetition of the steps of:
 (b-1) forming a plurality of quantum dots of a third group III nitride, said third group III nitride being $Ga_yIn_{1-y}N$ ($0<y\leqq1$), by self-organization; and
 (b-2) forming a matrix layer of a fourth group III nitride, said fourth group III nitride being $Al_zGa_{1-z}N$ ($0<z\leqq1$),
 said step (a) and said step (b) being sequentially performed by MBE,
 said n-type conductive layer and said matrix layer forming a matrix region,
 each layer forming said matrix region being formed so as to maintain alignment of said matrix region with said underlying layer and thereby to have a lattice constant which is smaller than an ideal lattice constant that a substance with the same composition has under non-stress conditions.

3. The method according to claim 1, wherein an abundance ratio of Al in said fourth group III nitride is not more than that in said second group III nitride.

4. The method according to claim 1, wherein said third group III nitride is GaN.

5. The method according to claim 1, wherein in said step (b-1), said quantum dots are formed of said third group III nitride doped with a rare-earth or transition-metal element.

6. The method according to claim 5, further comprising the steps of:
 (c) providing a first cladding layer in a lower end portion of said functional layer; and
 (d) providing a second cladding layer in an upper end portion of said functional layer,
 said step (a), said step (c), said step (b) and said step (d) being sequentially performed by MBE,
 said first and second cladding layers being formed of a group III nitride whose abundance ratio of Al being higher than that in said fourth group III nitride.

7. A semiconductor layered structure formed by epitaxial growth, comprising:
 a predetermined base material;
 an underlying layer formed of a first group III nitride on said base material, said first group III nitride being AlN;
 an n-type conductive layer formed of a second group III nitride doped with a predetermined n-type dopant, on said underlying layer, said second group III nitride being $Al_xGa_{1-x}N$ ($0<x\leqq1$); and
 a functional layer formed on said n-type conductive layer and having a quantum dot structure composed of repetition of unit layers, each of said unit layers being formed such that a plurality of quantum dots formed of a third group III nitride are buried in a matrix layer formed of a fourth group III nitride, said third group III nitride being $Ga_yIn_{1-y}N$ ($0<y\leqq1$) and said fourth group III nitride being $Al_zGa_{1-z}N$ ($0<z\leqq1$),
 said n-type conductive layer and said functional layer being sequentially formed by MBE,
 said n-type conductive layer and said matrix layer forming a matrix region,
 compression stress in a direction generally perpendicular to a direction of deposition remaining in each layer forming said matrix region.

8. A semiconductor layered structure formed by epitaxial growth, comprising:
 a base material;
 an underlying layer formed of a first group III nitride on said base material, said first group III nitride being AlN;
 an n-type conductive layer formed of a second group III nitride doped with a predetermined n-type dopant, on said underlying layer, said second group III nitride being $Al_xGa_{1-x}N$ ($0<x\leqq1$); and
 a functional layer formed on said n-type conductive layer and having a quantum dot structure composed of repetition of unit layers, each of said unit layers being formed such that a plurality of quantum dots formed of a third group III nitride are buried in a matrix layer formed of a fourth group III nitride, said third group III nitride being $Ga_yIn_{1-y}N$ ($0<y\leqq1$) and said fourth group III nitride being $Al_zGa_{1-z}N$ ($0<z\leqq1$),
 said n-type conductive layer and said functional layer being sequentially formed by MBE,
 said n-type conductive layer and said matrix layer forming a matrix region, said matrix region being formed so that the entirety of said matrix region is in alignment with said underlying layer, each layer forming said matrix region having a lattice constant which is smaller than an ideal lattice constant that a substance with the same composition has under non-stress conditions.

9. The semiconductor layered structure according to claim 7, wherein an abundance ratio of Al in said fourth group III nitride is not more than that in said second group III nitride.

10. The semiconductor layered structure according to claim 7, wherein said third group III nitride is GaN.

11. The semiconductor layered structure according to claim 7, wherein said quantum dots are formed of said third group III nitride doped with a rare-earth or transition-metal element.

12. The semiconductor layered structure according to claim 11, further comprising:
a first cladding layer provided in a lower end portion of said functional layer; and
a second cladding layer provided in an upper end portion of said functional layer,
said n-type conductive layer, said first cladding layer, said functional layer and said second cladding layer being sequentially formed by MBE,
said first and second cladding layers being formed of a group III nitride whose abundance ratio of Al being higher than that in said fourth group III nitride.

13. A light emitting device comprising:
a predetermined p-type conductive layer formed on a functional layer in a semiconductor layered structure; and
a predetermined electrode formed on each of an n-type conductive layer and said p-type conductive layer,
said semiconductor layered structure being obtained by the method of epitaxial growth, comprising the steps of:
(a) forming said n-type conductive layer of a second group III nitride doped with a predetermined n-type dopant, on an underlying substrate which is obtained by forming an underlying layer of a first group III nitride on a predetermined base material, said first group III nitride being AlN and said second group III nitride being $Al_xGa_{1-x}N$ ($0<x\leq1$); and
(b) forming said functional layer with a quantum dot structure on said n-type conductive layer by repetition of the steps of:
(b-1) forming a plurality of quantum dots of a third group III nitride by self-organization, said quantum dots being formed of said third group III nitride doped with a rare-earth or transition-metal element, said third group III nitride being $Ga_yIn_{1-y}N$ ($0<y\leq1$); and
(b-2) forming a matrix layer of a fourth group III nitride, said fourth group III nitride being $Al_zGa_{1-z}N$ ($0<z\leq1$),
said step (a) and said step (b) being sequentially performed by MBE, said n-type conductive layer and said matrix layer forming a matrix region,
each layer forming said matrix region being formed while maintaining compression stress in a direction generally perpendicular to a direction of deposition, said compression stress acting on an interface between said underlying layer and said matrix region,
said step (b-1) being performed in the presence of said compression stress.

14. The light emitting device according to claim 13, wherein said p-type conductive layer includes a superlattice structure including layers of a fifth group III nitride and layers of a sixth group III nitride deposited together in an alternating pattern, each of said layers of the fifth and sixth group III nitrides being doped with a predetermined p-type dopant.

15. A light emitting device comprising:
a predetermined p-type conductive layer formed on a functional layer in a semiconductor layered structure; and
a predetermined electrode formed on each of an n-type conductive layer and said p-type conductive layer,
said semiconductor layered structure being formed by epitaxial growth, comprising:
a predetermined base material;
an underlying layer formed of a first group III nitride on said base material, said first group III nitride being AlN;
said n-type conductive layer formed of a second group III nitride doped with a predetermined n-type dopant, on said underlying layer, said second group III nitride being $Al_xGa_{1-x}N$ ($0<x\leq1$); and
said functional layer formed on said n-type conductive layer and having a quantum dot structure composed of repetition of unit layers, said quantum dots being formed of said third group III nitride doped with a rare-earth or transition-metal element, each of said unit layers being formed such that a plurality of quantum dots formed of a third group III nitride are buried in a matrix layer formed of a fourth group III nitride, said third group III nitride being $Ga_yIn_{1-y}N$ ($0<y\leq1$) and said fourth group III nitride being $Al_zGa_{1-z}N$ ($0<z\leq1$),
said n-type conductive layer and said functional layer being sequentially formed by MBE,
said n-type conductive layer and said matrix layer forming a matrix region,
compression stress in a direction generally perpendicular to a direction of deposition remaining in each layer forming said matrix region.

16. The light emitting device according to claim 15, wherein said p-type conductive layer includes a superlattice structure including layers of a fifth group III nitride and layers of a sixth group III nitride deposited together in an alternating pattern, each of said layers of the fifth and sixth group III nitrides being doped with a predetermined p-type dopant.

* * * * *